United States Patent
Sawabe et al.

(10) Patent No.: US 9,434,023 B2
(45) Date of Patent: Sep. 6, 2016

(54) LASER MACHINING APPARATUS

(71) Applicant: DISCO CORPORATION, Tokyo (JP)

(72) Inventors: Taiki Sawabe, Tokyo (JP); Wakana Onoe, Tokyo (JP); Tomohiro Endo, Tokyo (JP)

(73) Assignee: Disco Corporation, Tokyo (JP)

( * ) Notice: Subject to any disclaimer, the term of this patent is extended or adjusted under 35 U.S.C. 154(b) by 352 days.

(21) Appl. No.: 14/244,391

(22) Filed: Apr. 3, 2014

(65) Prior Publication Data
US 2014/0299586 A1    Oct. 9, 2014

(30) Foreign Application Priority Data

Apr. 5, 2013  (JP) ................. 2013-079640

(51) Int. Cl.
| | |
|---|---|
| *G01B 11/00* | (2006.01) |
| *H01L 21/68* | (2006.01) |
| *B23K 26/04* | (2014.01) |
| *B23K 26/042* | (2014.01) |
| *B23K 26/359* | (2014.01) |
| *B23K 26/03* | (2006.01) |

(52) U.S. Cl.
CPC ............. *B23K 26/032* (2013.01); *B23K 26/04* (2013.01); *B23K 26/042* (2015.10); *B23K 26/359* (2015.10); *G01B 11/00* (2013.01); *H01L 21/68* (2013.01)

(58) Field of Classification Search
CPC ....... G01B 11/00; H01L 21/68; H01L 21/78; B23K 26/02; B23K 26/03; B23K 26/04; B23K 26/042; B23K 26/351; B23K 26/359; B23K 26/362; B23K 26/364
USPC ............ 219/121.62, 121.68, 121.82, 121.83; 250/492.2; 438/463; 356/630
See application file for complete search history.

(56) References Cited

U.S. PATENT DOCUMENTS

| | | | | |
|---|---|---|---|---|
| 5,268,744 | A * | 12/1993 | Mori ..................... | G03F 9/7023 250/201.4 |
| 7,428,062 | B2 * | 9/2008 | Nomaru ................. | B23K 26/03 250/201.3 |
| 8,834,230 | B2 * | 9/2014 | Furukawa ............. | B24B 37/042 451/36 |
| 9,293,372 | B2 * | 3/2016 | Nagaoka ............. | H01L 21/6835 |

FOREIGN PATENT DOCUMENTS

| | | |
|---|---|---|
| JP | 2002-192370 | 7/2002 |
| JP | 2009-063446 | 3/2009 |
| JP | 2011-122894 | 6/2011 |
| JP | 2012-002604 | 1/2012 |

\* cited by examiner

*Primary Examiner* — Samuel M Heinrich
(74) *Attorney, Agent, or Firm* — Greer Burns & Crain Ltd.

(57) ABSTRACT

A laser machining apparatus that includes an interferometric height position detection unit, a condensing point position adjustment unit, and a confocal optical height position detection unit. A controller of the laser machining apparatus specifies, as a correction value, the difference between the two height positions of the upper face of the workpiece, one detected by the confocal optical height position detection unit and the other detected by the interferometric height position detection unit. The controller controls the condensing point position adjustment unit based on the height position obtained by correcting the height position of the upper face of the workpiece detected by the interferometric height position detection unit using the correction value.

1 Claim, 11 Drawing Sheets

LASER MACHINING APPARATUS

BACKGROUND OF THE INVENTION

1. Field of the Invention

The present invention relates to a laser machining apparatus having functionality to detect the height position of the upper face of a workpiece held by a chuck table adapted to hold a workpiece.

2. Description of the Related Art

In a semiconductor device manufacturing process, devices such as ICs or LSIs are formed in a plurality of partitioned areas on the front face of an approximately disc-shaped semiconductor wafer. The plurality of areas are partitioned by a plurality of scheduled division lines called streets. The streets are arranged in a grid pattern. Then, the semiconductor wafer is cut along the streets, thus dividing the areas having devices formed therein and manufacturing individual semiconductor devices. On the other hand, an optical device wafer is formed by stacking a light-emitting layer made up of p- and n-type semiconductor layers, for example, on the front face of an approximately disc-shaped sapphire, silicon carbide, or gallium nitride substrate, and by forming light-emitting diodes, laser diodes or other optical devices in a plurality of areas partitioned by a plurality of streets. The streets are formed in a grid pattern. Then, the optical device wafer is cut along the streets, thus manufacturing individual optical devices.

As a method of dividing a semiconductor wafer, optical device wafer, or other type of wafer along streets, attempts have been made to use a laser machining method. This method employs a pulsed laser beam that penetrates a wafer and irradiates the pulsed laser beam to a condensing point inside an area to be divided. With this division method based on a laser machining method, a pulsed laser beam at a wavelength that penetrates a wafer is irradiated from one face of a wafer. The laser beam is irradiated to a condensing point inside the wafer. This continuously forms a modified layer inside the wafer along the streets. An external force is exerted on the streets whose strength has declined as a result of formation of the modified layer, thus dividing the workpiece (refer, for example, to Japanese Patent No. 3408805). If a modified layer is formed inside a workpiece along streets as described above, it is important to position a condensing point of a laser beam at a given depth from the upper face of the workpiece.

However, disc-shaped workpieces such as semiconductor wafers have undulations and vary in thickness. This makes it difficult to laser-machine a workpiece in a uniform manner. That is, if a modified layer is formed inside a wafer along streets, but if the wafer varies in thickness, a modified layer cannot be formed in a uniform manner at a given depth due to the relationship with the refractive index at the time of irradiation of a laser beam.

In order to solve the above problem, an interferometric height position detector is disclosed in Japanese Patent Laid-open Nos. 2011-122894 and 2012-2604. The interferometric height position detector detects the position of the upper face of a wafer held by a chuck table adapted to hold a workpiece based on the interference between light reflected from the upper face of the wafer and reference light. Further, a confocal optical height position detector is disclosed in Japanese Patent Laid-open No. 2009-63446. This detector detects the height position of the upper face of a wafer held by a chuck table adapted to hold a workpiece.

SUMMARY OF THE INVENTION

The above interferometric height position detector features a wide measurement range and high detection speed. In contrast, the confocal optical height position detector is advantageous in that it can accurately measure the height position of a workpiece although lower in detection speed than the interferometric height position detector.

For a laser machining apparatus adapted to perform laser machining while at the same time detecting the height position of the upper face of a wafer held by a chuck table adapted to hold a workpiece and controlling the position of the condensing point of a laser beam in accordance with the height position of the upper face of the wafer, it is desirable to incorporate an interferometric height position detector that offers a large detection range and high detection speed. However, in the case of an optical device wafer having a light-emitting layer formed on the front face of a sapphire substrate and a reflecting film called DBR (Distributed Bragg Reflector) film adapted to provide improved brightness formed on the rear face of the sapphire substrate, the interference may be disturbed between light reflected from the upper face position of the wafer held by a chuck table to which a laser beam is to be irradiated and reference light, possibly making it impossible to properly measure the position of the upper face of the wafer.

In light of the foregoing, it is an object of the present invention to provide a laser machining apparatus having a height position detection function capable of quickly and accurately measuring the height position of the upper face of a workpiece such as a semiconductor wafer held by a chuck table.

In accordance with an aspect of the present invention, there is provided a laser machining apparatus that includes a chuck table, laser beam irradiation means, interferometric height position detection means, condensing point position adjustment means, control means, and confocal optical height position detection means. The chuck table has a holding face adapted to hold a workpiece. The laser beam irradiation means has an objective condenser lens adapted to condense and irradiate a laser beam onto the workpiece held by the chuck table. The interferometric height position detection means detects the height position of the upper face of the workpiece held by the chuck table based on the interference between light reflected from the upper face of the workpiece and reference light. The condensing point position adjustment means moves the objective condenser lens vertically relative to the holding face of the chuck table. The control means controls the condensing point position adjustment means based on the height position of the upper face of the workpiece detected by the interferometric height position detection means. The confocal optical height position detection means detects the height position of the upper face of the workpiece held by the chuck table. The control means specifies, as a correction value, the difference between the two height positions of the upper face of the workpiece held by the chuck table, one detected by the confocal optical height position detection means and the other detected by the interferometric height position detection means. The control means controls the condensing point position adjustment means based on the height position obtained by correcting the height position of the upper face of the workpiece detected by the interferometric height position detection means using the correction value.

In the laser machining apparatus according to the present invention, the difference between the two height positions of the upper face of the workpiece held by the chuck table is specified as a correction value, one detected by the confocal optical height position detection means and the other detected by the interferometric height position detection means. The condensing point position adjustment means is controlled based on the height position obtained by correcting the height position of the upper face of the workpiece detected by the interferometric height position detection means using the correction value. Therefore, even in the event of disturbance in the interference between the light reflected from the upper face of the workpiece and the reference light during measurement of the height position by the interferometric height position detection means, the height position is corrected with a measured value of the confocal optical height position detection means capable of accurate height position measurement, thus allowing for proper measurement of the height position of the upper face of the workpiece.

The above and other objects, features and advantages of the present invention and the manner of realizing them will become more apparent, and the invention itself will best be understood from a study of the following description and an appended claim with reference to the attached drawings showing a preferred embodiment of the invention.

DETAILED DESCRIPTION OF THE PREFERRED EMBODIMENT

Figure 1:
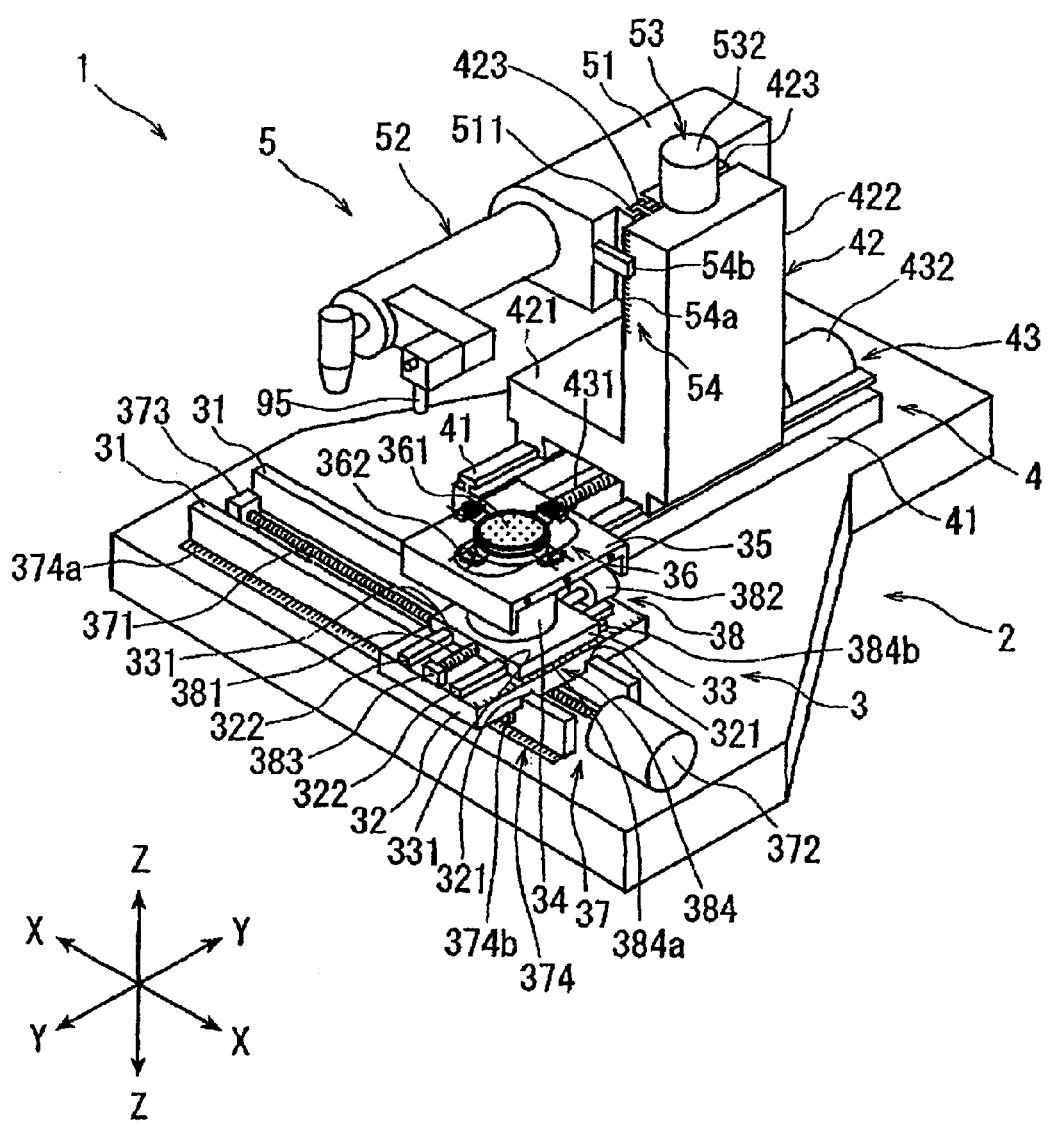
FIG. 1 is a perspective view of a laser machining apparatus configured in accordance with the present invention.

A detailed description will be given below of a preferred embodiment of the present invention with reference to the accompanying drawings. FIG. 1 illustrates a perspective view of a laser machining apparatus configured in accordance with the present invention. A laser machining apparatus 1 illustrated in FIG. 1 includes a stationary base 2, a chuck table mechanism 3, a laser beam irradiation unit support mechanism 4, and a position detection/laser irradiation unit 5. The chuck table mechanism 3 is arranged on the stationary base 2 in a manner movable in a machining feed direction shown by an arrow X (X-axis direction) to hold a workpiece. The laser beam irradiation unit support mechanism 4 is arranged on the stationary base 2 in a manner movable in an indexing feed direction shown by an arrow Y (Y-axis direction). The indexing feed direction is orthogonal to the X-axis direction. The position detection/laser irradiation unit 5 is arranged on the laser beam irradiation unit support mechanism 4 in a manner movable in a condensing point position adjustment direction shown by an arrow Z (Z-axis direction).

The chuck table mechanism 3 includes a pair of guide rails 31, a first sliding block 32, a second sliding block 33, a support table 35, and a chuck table 36. The guide rails 31 are arranged on the stationary base 2 to be parallel to each other along the X-axis direction. The first sliding block 32 is arranged on the guide rails 31 in a manner movable in the X-axis direction. The second sliding block 33 is arranged on the first sliding block 32 in a manner movable in the Y-axis direction. The support table 35 is supported on the second sliding block 33 by a cylindrical member 34. The chuck table 36 serves as workpiece holding means. The chuck table 36 includes a suction chuck 361 that is made of a porous material. The suction chuck 361 holds, for example, a circular semiconductor wafer, a workpiece, using unshown suction means on its holding surface, the upper face thereof. The chuck table 36 configured as described above is rotated by an unshown pulse motor arranged in the cylindrical member 34. It should be noted that a clamp 362 is arranged on the chuck table 36. The clamp 362 fastens an annular frame that supports a workpiece such as a semiconductor wafer via a protective tape.

A pair of guided grooves 321 are provided on the lower face of the first sliding block 32 to engage with the guide rails 31. A pair of guide rails 322 are formed on the upper face of the first sliding block 32. The guide rails 322 are formed parallel to each other along the X-axis direction. The first sliding block 32 configured as described above can move in the X-axis direction along the pair of guide rails 31 as the guided grooves 321 engage with the pair of guide rails 31. The chuck table mechanism 3 in the illustrated embodiment includes machining feed means 37. The machining feed means 37 moves the first sliding block 32 in the X-axis direction along the pair of guide rails 31. The machining feed means 37 includes a male threaded rod 371 and a drive source such as a pulse motor 372. The male threaded rod 371 is arranged between and parallel to the pair of guide rails 31. The pulse motor 372 drives the male threaded rod 371 to rotate. The male threaded rod 371 has its one end supported by a bearing block 373 in a manner free to rotate. The bearing block 373 is fastened to the stationary base 2. The male threaded rod 371 has its other end connected for power transmission to the output shaft of the pulse motor 372. It should be noted that the male threaded rod 371 is screwed in a through female threaded hole formed in an unshown female threaded block that is provided to protrude on the lower face of the central portion of the first sliding block 32. Therefore, the first sliding block 32 can move in the X-axis direction along the guide rails 31 as the male threaded rod 371 is driven to rotate in normal and reverse directions by the pulse motor 372.

The laser machining apparatus 1 includes machining feed rate detection means 374 adapted to detect the machining feed rate of the chuck table 36. The machining feed rate detection means 374 includes a linear scale 374a and a read head 374b. The linear scale 374a is arranged along the guide rail 31. The read head 374b is arranged on the first sliding block 32 to move together with the first sliding block 32 along the linear scale 374a. The read head 374b of the machining feed rate detection means 374 transmits, to control means which will be described later, a pulse signal of one pulse every 1 µm in the present embodiment. Then, the control means which will be described later counts the number of supplied pulse signals, thus detecting the machining feed rate of the chuck table 36. It should be noted that if the pulse motor 372 is used as a drive source of the machining feed means 37, it is possible to detect the machining feed rate of the chuck table 36 by counting the number of drive pulses of the control means described later adapted to output drive signals to the pulse motor 372. Further, if a servo motor is used as a drive source of the machining feed means 37, it is possible to detect the machining feed rate of the chuck table 36 by sending pulse signals output from a rotary encoder adapted to detect the rotation speed of the servo motor to the control means which will be described later and causing the control means to count the number of supplied pulse signals.

A pair of guided grooves 331 are provided on the lower face of the second sliding block 33 to engage with the pair of guide rails 322 provided on the upper face of the first sliding block 32. The second sliding block 33 can move in the Y-axis direction as the guided grooves 331 engage with the pair of guide rails 322. The chuck table mechanism 3 in the illustrated embodiment includes first indexing feed means 38. The first indexing feed means 38 moves the second sliding block 33 in the Y-axis direction along the pair of guide rails 322 provided on the first sliding block 32. The first indexing feed means 38 includes a male threaded rod 381 and a drive source such as a pulse motor 382. The male threaded rod 381 is arranged between and parallel to the pair of guide rails 322. The pulse motor 382 drives the male threaded rod 381 to rotate. The male threaded rod 381 has its one end supported by a bearing block 383 in a manner free to rotate. The bearing block 383 is fastened to the upper face of the first sliding block 32. The male threaded rod 381 has its other end connected for power transmission to the output shaft of the pulse motor 382. It should be noted that the male threaded rod 381 is screwed in a through female threaded hole formed in an unshown female threaded block that is provided to protrude on the lower face of the central portion of the second sliding block 33. Therefore, the second sliding block 33 can move in the Y-axis direction along the guide rails 322 as the male threaded rod 381 is driven to rotate in normal and reverse directions by the pulse motor 382.

The laser machining apparatus 1 includes indexing feed rate detection means 384 adapted to detect the indexing feed rate of the second sliding block 33. The indexing feed rate detection means 384 includes a linear scale 384a and a read head 384b. The linear scale 384a is arranged along the guide rail 322. The read head 384b is arranged on the second sliding block 33 to move together with the second sliding block 33 along the linear scale 384a. The read head 384b of the indexing feed rate detection means 384 transmits, to the control means which will be described later, a pulse signal of one pulse every 1 µm in the illustrated embodiment. Then, the control means which will be described later counts the number of supplied pulse signals, thus detecting the indexing feed rate of the chuck table 36. It should be noted that if the pulse motor 382 is used as a drive source of the first indexing feed means 38, it is possible to detect the indexing feed rate of the chuck table 36 by counting the number of drive pulses of the control means described later adapted to output drive signals to the pulse motor 382. Further, if a servo motor is used as a drive source of the first indexing feed means 38, it is possible to detect the indexing feed rate of the chuck table 36 by sending pulse signals output from a rotary encoder adapted to detect the rotation speed of the servo motor to the control means which will be described later and causing the control means to count the number of supplied pulse signals.

The laser beam irradiation unit support mechanism 4 includes a pair of guide rails 41 and a movable support base 42. The guide rails 41 are arranged on the stationary base 2 to be parallel to each other along the Y-axis direction. The movable support base 42 is arranged on the guide rails 41 in a manner movable in the direction shown by the arrow Y. The movable support base 42 includes a movable support section 421 and an attachment section 422. The movable support section 421 is arranged on the guide rails 41 in a movable manner. The attachment section 422 is attached to the movable support section 421. A pair of guide rails 423 are provided on one side face of the attachment section 422. The guide rails 423 are parallel to each other and extend in the Z-axis direction. The laser beam irradiation unit support mechanism 4 includes second indexing feed means 43. The second indexing feed means 43 moves the movable support base 42 in the Y-axis direction along the pair of guide rails 41. The second indexing feed means 43 includes a male threaded rod 431 and a drive source such as a pulse motor 432. The male threaded rod 431 is arranged between and parallel to the pair of guide rails 41. The pulse motor 432 drives the male threaded rod 431 to rotate. The male threaded rod 431 has its one end supported by an unshown bearing block in a manner free to rotate. The bearing block is fastened to the stationary base 2. The male threaded rod 431 has its other end connected for power transmission to the output shaft of the pulse motor 432. It should be noted that the male threaded rod 431 is screwed in a female threaded hole formed in an unshown female threaded block that is provided to protrude on the lower face of the central portion of the movable support section 421. Therefore, the movable support base 42 can move in the Y-axis direction along the guide rails 41 as the male threaded rod 431 is driven to rotate in normal and reverse directions by the pulse motor 432.

The position detection/laser irradiation unit 5 includes a unit holder 51 and a cylindrical unit housing 52. The unit housing 52 is attached to the unit holder 51. The unit holder 51 is arranged on the attachment section 422 of the movable support base 42 in a manner movable along the pair of guide rails 423. Interferometric height position detection means and laser beam irradiation means are arranged on the unit housing 52 attached to the unit holder 51. The interferometric height position detection means detects the height position of a workpiece held by the chuck table 36. The laser beam irradiation means irradiates a laser beam onto the workpiece held by the chuck table 36. The interferometric height position detection means and the laser beam irradiation means will be described with reference to FIG. 2

Interferometric height position detection means 6 includes a light source 61, first light division means 62, a collimation lens 63, and second light division means 64. The light source 61 emits light having a given range of wavelengths. The first light division means 62 not only guides light from the light source 61 into a first path 6a but also guides the reflected light traveling backward in the first path 6a into a second path 6b. The collimation lens 63 shapes light guided into the first path 6a into a parallel beam. The second light division means 64 splits light, shaped into a parallel beam by the collimation lens 63, into two paths, a third path 6c and a fourth path 6d.

An LED, an SLD, an LD, a halogen light source, an ASE light source, or a supercontinuum light source adapted to emit light in the wavelength range of 820 to 870 nm can be, for example, used as the light source 61. A polarization maintaining fiber coupler, a polarization maintaining fiber circulator, a single-mode fiber coupler, a single-mode fiber coupler circulator, or other device can be used as the first light division means 62. The second light division means 64 includes a beam splitter 641 and a direction change mirror 642. It should be noted that the path from the light source 61 to the first light division means 62 and the first path 6a are made of optical fibers.

An objective condenser lens 65 and a condenser lens 66 are arranged in the third path 6c. The objective condenser lens 65 guides light, guided into the third path 6c, to a workpiece W held by the chuck table 36. The condenser lens 66 is arranged between the objective condenser lens 65 and the second light division means 64. The condenser lens 66 condenses the parallel beam (collimated beam) guided from the second light division means 64 into the third path 6c and positions a condensing point inside the objective condenser lens 65, thus shaping light from the objective condenser lens 65 into a pseudo parallel beam. If the condenser lens 66 is arranged between the objective condenser lens 65 and the second light division means 64 to shape light from the objective condenser lens 65 into a pseudo parallel beam as described above, light reflected by the workpiece W held by the chuck table 36 can be converged into an optical fiber making up the first path 6a when reflected light travels backward via the objective condenser lens 65, the condenser lens 66, the second light division means 64, and the collimation lens 63. It should be noted that the objective condenser lens 65 is attached to a lens case 651, and that the lens case 651 is moved vertically in FIG. 2, i.e., in a condensing point position adjustment direction (Z-axis direction) perpendicular to the holding face of the chuck table 36, by first condensing point position adjustment means 650. The first condensing point position adjustment means 650 includes for example a voice coil motor or a linear motor and is controlled by the control means which will be described later.

A reflecting mirror 67 is arranged in the fourth path 6d to reflect a parallel beam guided into the fourth path 6d so as to cause the beam to travel backward in the fourth path 6d. The reflecting mirror 67 is attached to the lens case 651 of the objective condenser lens 65 in the present embodiment.

A collimation lens 68, a diffraction grating 69, a condenser lens 70, and a line image sensor 71 are arranged in the second path 6b. The collimation lens 68 shapes two reflected beams into parallel beams. One of them is a beam that is reflected by the reflecting mirror 67, travels backward through the fourth path 6d, the second light division means 64, the collimation lens 63, and the first path 6a, and is guided from the first light division means 62 into the second path 6b. The other thereof is a beam that is reflected by the workpiece W held by the chuck table 36, travels backward through the objective condenser lens 65, the condenser lens 66, the second light division means 64, the collimation lens 63, and the first path 6a, and is guided from the first light division means 62 into the second path 6b. The diffraction grating 69 diffracts the interference between the two reflected beams and transmits diffraction signals, one for each wavelength, to the line image sensor 71 via the condenser lens 70. The line image sensor 71 detects the optical intensities of the reflected beams diffracted by the diffraction grating 69 at the respective wavelengths, transmitting a detection signal to control means 80.

The control means 80 finds a spectroscopic interference waveform from the detection signal transmitted from the line image sensor 71 and analyzes the waveform based on the spectroscopic interference waveform and a theoretical wave function. Then, the control means 80 finds the difference in optical path length between the optical path length to the workpiece W held by the chuck table 36 in the third path 6c and the optical path length to the reflecting mirror 67 in the fourth path 6d and finds, based on the difference in optical path length, the distance from the front face of the chuck table 36 to the upper face of the workpiece W held by the chuck table 36, i.e., the height position of the upper face of the workpiece W. It should be noted that the wave analysis based on the Fourier transform theory performed based on the spectroscopic interference waveform and the theoretical wave function is disclosed, for example, in Japanese Patent Laid-open No. 2011-122894. Therefore, a detailed description thereof is omitted in the present specification by incorporating the contents of the disclosed publication by reference.

Figure 2:
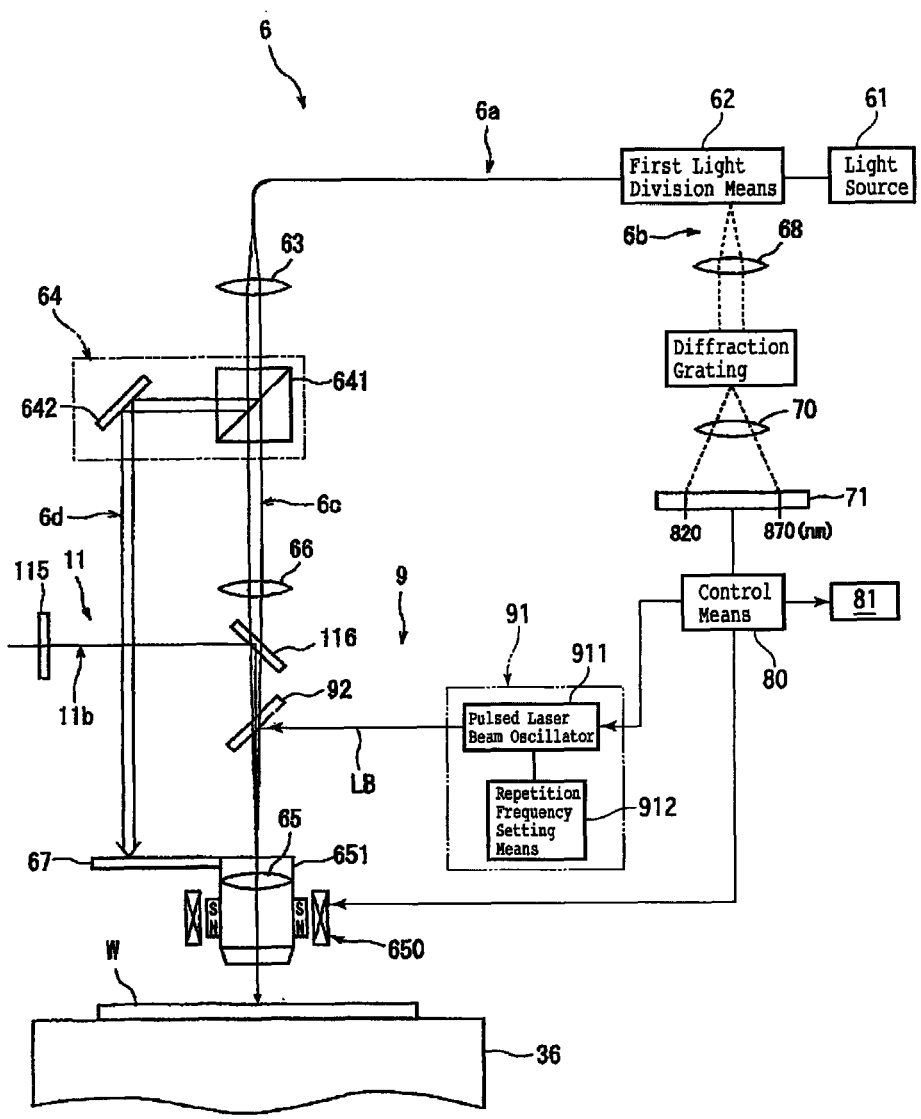
FIG. 2 is a block configuration diagram of a position detection device and laser beam irradiation means making up a position detection/laser irradiation unit incorporated in the laser machining apparatus illustrated in FIG. 1.

Continuing the description with reference to FIG. 2, laser beam irradiation means 9 arranged on the unit housing 52 of the position detection/laser irradiation unit 5 shown in FIG. 1 includes pulsed laser beam oscillation means 91 and a dichroic mirror 92. The dichroic mirror 92 changes the direction of the pulsed laser beam oscillated by the pulsed laser beam oscillation means 91 to the objective condenser lens 65. The pulsed laser beam oscillation means 91 includes a pulsed laser beam oscillator 911 and repetition frequency setting means 912. The pulsed laser beam oscillator 911 includes a YAG laser oscillator or YVO4 laser oscillator. The repetition frequency setting means 912 is provided as an accessory of the pulsed laser beam oscillator 911. The pulsed laser beam oscillation means 91 oscillates, for example, a pulsed laser beam of 1064 nm in wavelength. The dichroic mirror 92 is arranged between the condenser lens 66 and the objective condenser lens 65 and passes light from the condenser lens 66 but reflects, for example, a pulsed laser beam of 1064 nm in wavelength oscillated by the pulsed laser beam oscillation means 91 to the objective condenser lens 65. Therefore, the pulsed laser beam (LB) oscillated by the pulsed laser beam oscillation means 91 is reflected by the dichroic mirror 92, enters the objective condenser lens 65, and is condensed by the objective condenser lens 65 and irradiated onto the workpiece W held by the chuck table 36. Therefore, the objective condenser lens 65 has functionality of an objective condenser lens that makes up the laser beam irradiation means 9.

Continuing the description with reference back to FIG. 1, the laser machining apparatus 1 includes second condensing point position adjustment means 53. The second condensing point position adjustment means 53 moves the unit holder 51 along the guide rails 423 provided on the attachment section 422 of the movable support base 42 in the condensing point position adjustment direction (Z-axis direction) shown by the arrow Z, i.e., the direction perpendicular to the holding face of the chuck table 36. The second condensing point position adjustment means 53 includes a male threaded rod (not shown) and a drive source such as a pulse motor 532. The male threaded rod is arranged between and parallel to the pair of guide rails 423. The pulse motor 532 drives the male threaded rod to rotate. The position detection/laser irradiation unit 5 can move in the Z-axis direction along the guide rails 423 as the male threaded rod is driven to rotate in normal and reverse directions by the pulse motor 532. It should be noted that, in the present embodiment, the position detection/laser irradiation unit 5 moves upward as the pulse motor 532 is driven in normal direction, and the same unit 5 moves downward as the pulse motor 532 is driven in reverse direction.

The position detection/laser irradiation unit 5 includes Z-axis direction position detection means 54. The Z-axis direction position detection means 54 detects the position of the unit housing 52 making up the position detection/laser irradiation unit 5 in the condensing point position adjustment direction (Z-axis direction). The Z-axis direction position detection means 54 includes a linear scale 54a and a read head 54b. The linear scale 54a is arranged parallel to the guide rails 423. The read head 54b is attached to the unit holder 51 to move together with the unit holder 51 along the linear scale 54a. The read head 54b of the Z-axis direction position detection means 54 transmits, to the control means 80, a pulse signal of one pulse every 0.1 µm in the present embodiment.

Imaging means 95 is arranged on the front edge portion of the unit housing 52 that makes up the position detection/laser irradiation unit 5. The imaging means 95 includes, in addition to an ordinary imaging element (CCD) adapted to capture an image using visible radiation, infrared lighting means, optics, and an imaging element (infrared CCD), and so on. The infrared lighting means irradiates infrared radiation onto the workpiece. The optics captures the infrared radiation irradiated by the infrared lighting means. The imaging element (infrared CCD) outputs an electric signal whose level is proportional to the infrared radiation captured by the optics. The imaging means 95 transmits the captured image signal to the control means 80.

Continuing the description with reference to FIG. 2, the laser machining apparatus 1 includes confocal optical height position detection means 11. The confocal optical height position detection means 11 detects the height position of the upper face of the workpiece held by the chuck table 36. A description will be given of an example of the confocal optical height position detection means 11 with reference to FIG. 3. The confocal optical height position detection means 11 illustrated in FIG. 3 includes inspection laser beam oscillation means 111, annular spot formation means 112, a first polarized beam splitter 113, and a half wavelength plate 114. The inspection laser beam oscillation means 111 oscillates an inspection laser beam to a first optical path 11a. The annular spot formation means 112 is arranged in the first optical path 11a and shapes the inspection laser beam oscillated by the inspection laser beam oscillation means 111 into an annular spot beam (in cross-sectional shape). The first polarized beam splitter 113 splits, to a second optical path 11b, the inspection laser beam shaped into an annular spot beam (in cross-sectional shape) by the annular spot formation means 112. The half wavelength plate 114 is arranged between the annular spot formation means 112 and the first polarized beam splitter 113.

As the inspection laser beam oscillation means 111, a He—Ne pulsed laser oscillator can be used which oscillates, for example, an inspection laser beam LB1a of 635 nm in wavelength. The annular spot formation means 112 includes first and second conical lenses 112a and 112b in the present embodiment. The first and second conical lenses 112a and 112b are arranged in series with a given spacing therebetween along the optical path of the inspection laser beam LB1a. It should be noted that although an example is shown in the present embodiment in which the first and second conical lenses 112a and 112b are arranged with their vertices facing each other, they may be arranged back to back or arranged to face in the same direction. The annular spot formation means 112 configured as described above shapes the inspection laser beam LB1a having a circular spot oscillated by the inspection laser beam oscillation means 111 into a laser beam LB1b having an annular spot. The half wavelength plate 114 adjusts the polarization plane of the inspection laser beam, a linearly polarized beam, oscillated by the inspection laser beam oscillation means 111 and shaped by the annular spot formation means 112 into the annular laser beam LB1b so that the inspection laser beam is S-polarized relative to the first polarized beam splitter 113. The first polarized beam splitter 113 reflects, to the second optical path 11b, the linearly polarized inspection laser beam that has been adjusted by the half wavelength plate 114 to be S-polarized and shaped into the annular laser beam LB1b. Further, the first polarized beam splitter 113 guides the reflected beam of the inspection laser beam into a third optical path 11c. The reflected beam of the inspection laser beam will be described later.

A quarter wavelength plate 115 is arranged in the second optical path 11b. Further, a dichroic mirror 116 is also arranged at the intersection between the second optical path 11b and the third path 6c of the interferometric height position detection means 6. The quarter wavelength plate 115 transforms, into a circularly polarized beam, the linearly polarized inspection laser beam that has been adjusted by the half wavelength plate 114 to be S-polarized and shaped into the annular laser beam LB1b. The dichroic mirror 116 passes light from the condenser lens 66 of the interferometric height position detection means 6 but reflects, to the objective condenser lens 65, the inspection laser beam of, for example, 635 nm in wavelength that has been transformed by the quarter wavelength plate 115 into a circularly polarized beam. The inspection laser beam whose direction has been changed to the objective condenser lens 65 is irradiated onto the upper face of the workpiece W held by the chuck table 36. The beam reflected therefrom reaches the quarter wavelength plate 115 via the dichroic mirror 116. The circularly polarized reflected beam of the inspection laser beam that has reached the quarter wavelength plate 115 is transformed into a P-polarized beam and reaches the first polarized beam splitter 113. The P-polarized reflected beam that has reached the first polarized beam splitter 113 passes through the first polarized beam splitter 113 and is guided into the third optical path 11c.

The confocal optical height position detection means 11 includes a pinhole mask 117, a half wavelength plate 118, a second polarized beam splitter 119, a condenser lens 120, and a first photoreception element 121. The pinhole mask 117 is arranged in the third optical path 11c and includes a pinhole 117a adapted to restrict the passage of a reflected beam larger than a given diameter. The half wavelength plate 118 adjusts the polarization plane of the reflected beam that has passed through the pinhole mask 117 so that the polarization plane is at 45 degrees to the second polarized beam splitter 119. The second polarized beam splitter 119 divides the reflected beam that has passed through the half wavelength plate 118 into fourth and fifth optical paths 11d and 11e. The condenser lens 120 condenses all the reflected beam divided into the fourth optical path 11d by the second polarized beam splitter 119. The first photoreception element 121 receives all the reflected beam condensed by the condenser lens 120. The first photoreception element 121 transmits, to the control means 80, a voltage signal whose level is proportional to the amount of light received. It should be noted that the pinhole 117a formed in the pinhole mask 117 is, for example, 1 mm in diameter. Further, the confocal optical height position detection means 11 includes a second photoreception element 122 and photoreception range restriction means 123. The second photoreception element 122 receives the reflected beam divided into the fifth optical path 11e by the second polarized beam splitter 119. The photoreception range restriction means 123 restricts the photoreception range of the reflected beam received by the second photoreception element 122. The photoreception range restriction means 123 includes a cylindrical lens 124 and a one-dimensional mask 125 in the present embodiment. The cylindrical lens 124 one-dimensionally condenses the reflected beam divided into the fifth optical path 11e by the second polarized beam splitter 119. The one-dimensional mask 125 restricts the reflected beam one-dimensionally condensed by the cylindrical lens 124 to a unit length. The second photoreception element 122 that receives the reflected beam that has passed through the one-dimensional mask 125 transmits, to the control means 80, a voltage signal whose level is proportional to the amount of light received.

Figure 3:
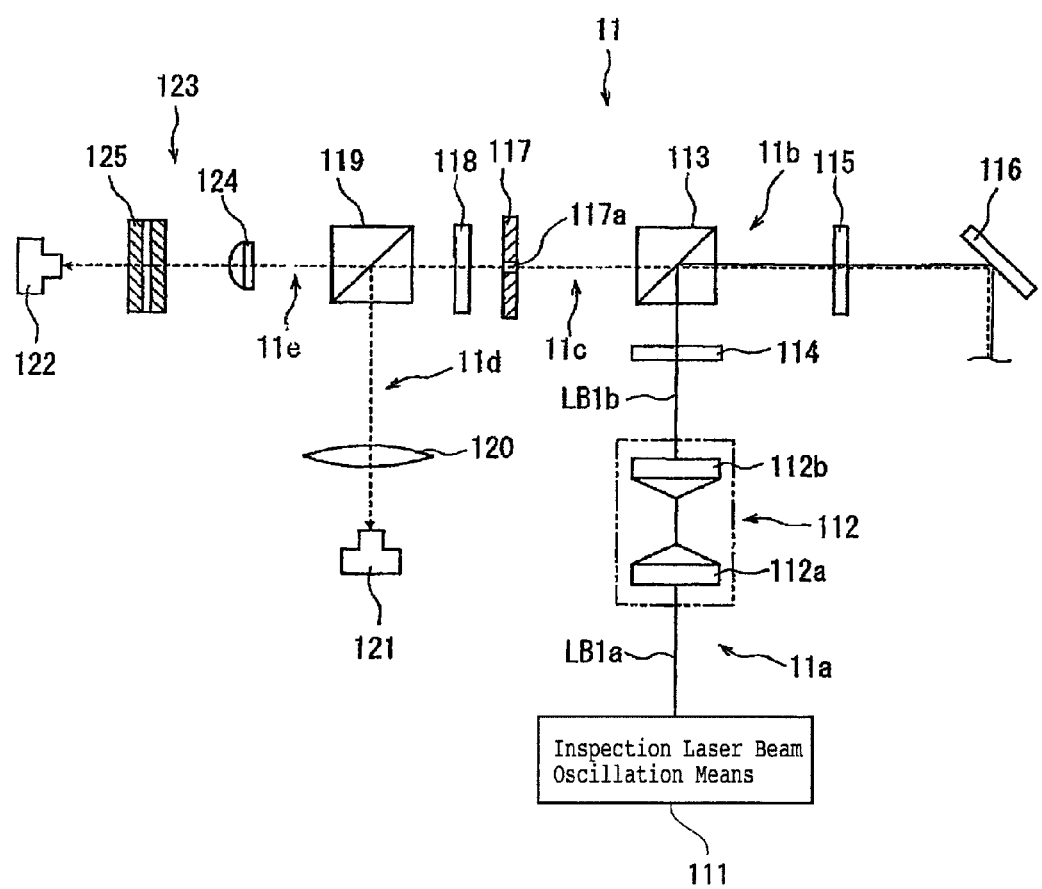
FIG. 3 is a block configuration diagram illustrating an example of confocal optical height position detection means incorporated in the laser machining apparatus illustrated in FIG. 1.
Figure 4A:
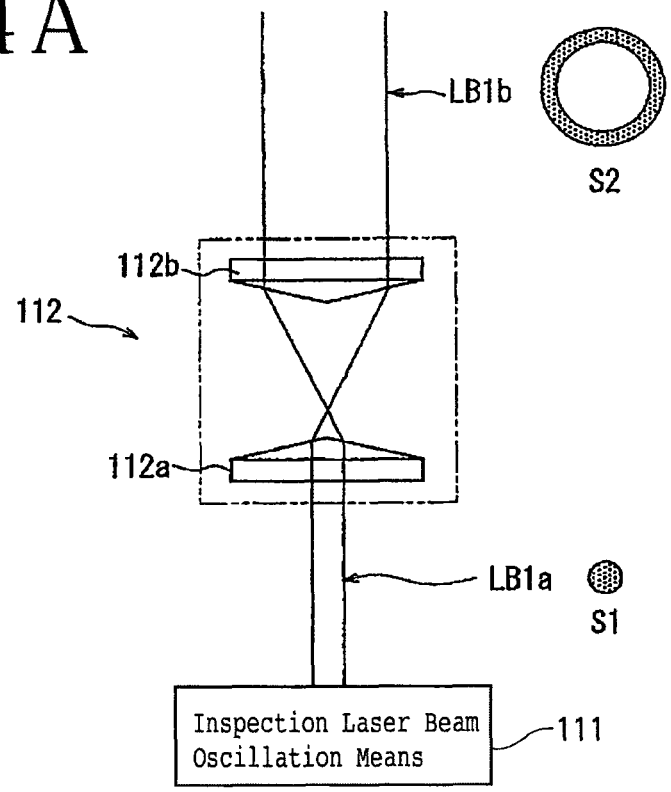
FIG. 4A is an explanatory diagram illustrating the manner in which a laser beam in the shape of a circular spot is shaped into a laser beam in the shape of an annular spot by annular spot formation means making up the confocal optical height position detection means illustrated in FIG. 3.

The confocal optical height position detection means 11 is configured as described above. A description will be given below of the workings thereof. As illustrated in FIG. 4A, the inspection laser beam LB1a having a circular spot shape S1 oscillated by the inspection laser beam oscillation means 111 is shaped into the inspection laser beam LB1b having an annular spot shape S2 by the annular spot formation means 112. That is, the annular spot formation means 112 expands the laser beam LB1a of 2 mm in diameter to the annular laser beam LB1b which is, for example, 10 mm in outer diameter (D1) and 8 mm in inner diameter (D2) and shapes the laser beam LB1a into a parallel beam. The polarization plane of the linearly polarized inspection laser beam LB1b shaped into the annular spot shape S2 by the annular spot formation means 112 is adjusted by the half wavelength plate 114 so that the inspection laser beam LB1b is S-polarized relative to the first polarized beam splitter 113 as illustrated in FIG. 3. Then, the inspection laser beam LB1b is guided into the first polarized beam splitter 113 and reflected by the same splitter 113 into the second optical path 11b. The inspection laser beam LB1b guided into the second optical path 11b reaches the dichroic mirror 116 and is reflected to the objective condenser lens 65 by the dichroic mirror 116 as illustrated in FIG. 2. The inspection laser beam LB1b reflected to the objective condenser lens 65 passes through the dichroic mirror 92 and is condensed by the objective condenser lens 65.

Figure 4B:
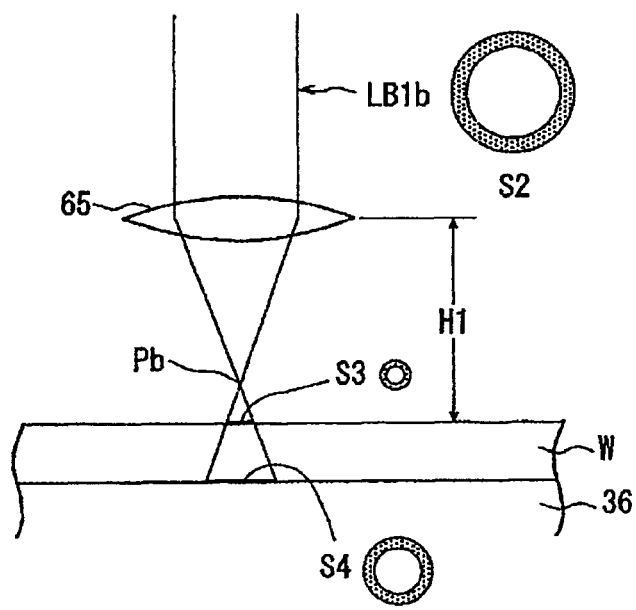
FIG. 4B is an explanatory diagram illustrating the manner in which a laser beam is irradiated onto a workpiece held by a chuck table.

If the inspection laser beam LB1b shaped into the annular spot shape S2 as described above is irradiated onto the upper face of the workpiece W held by the chuck table 36, a condensing point Pb is adjusted to be located upstream of (above) the upper face of the workpiece W in the laser beam irradiation direction as illustrated in FIG. 4B by activating the second condensing point position adjustment means 53. As a result, the inspection laser beam LB1b shaped into the annular spot shape S2 is irradiated onto the upper face of the workpiece W held by the chuck table 36 in an annular spot shape S3 and reflected at the size of the annular spot shape S3 (first reflected beam). At this time, if the workpiece W is made of sapphire or quartz, a transparent material, the inspection laser beam LB1b passes through the workpiece W, reaching the lower face and being reflected at the size of an annular spot shape S4 (second reflected beam).

Figure 5:
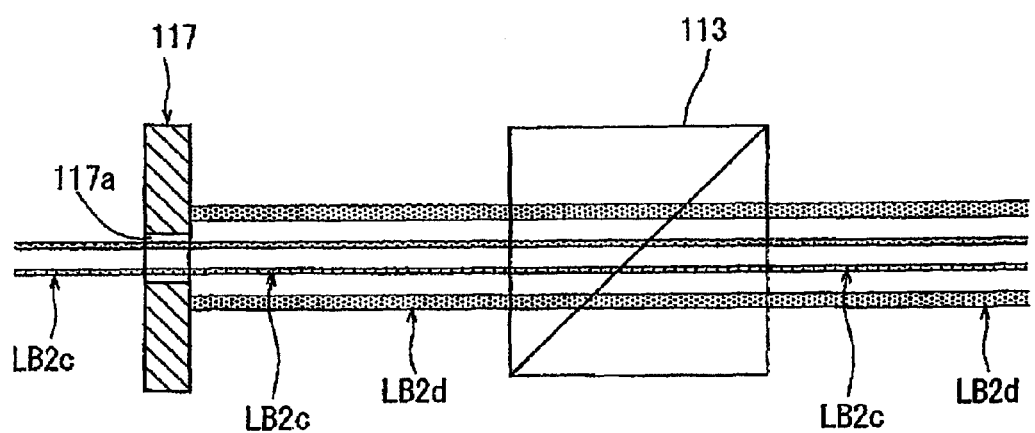
FIG. 5 is an explanatory diagram illustrating the manner in which part of reflected light divided by a first beam splitter making up the confocal optical height position detection means illustrated in FIG. 3 is blocked by a pinhole mask and the other part thereof passes through the pinhole mask.

As described above, the first reflected beam in the annular spot shape S3 reflected by the upper face of the workpiece W and the second reflected beam in the annular spot shape S4 reflected by the lower face of the workpiece W reach the dichroic mirror 116 via the objective condenser lens 65 and the dichroic mirror 92 and are reflected into the second optical path 11b by the dichroic mirror 116. The rotation direction of the reflected beams of the circularly polarized inspection laser beams guided into the second optical path 11b has been reversed. Therefore, the reflected beams are transformed into P-polarized beams by the quarter wavelength plate 115 and reach the first polarized beam splitter 113. As illustrated in FIG. 5, a first reflected beam LB2c in the annular spot shape S3 and a second reflected beam LB2d in the annular spot shape S4 that have reached the first polarized beam splitter 113 pass through the same beam splitter 113, being guided into the third optical path 11c and reaching the pinhole mask 117. The pinhole 117a formed in the pinhole mask 117 is, for example, 1 mm in diameter. Therefore, the first reflected beam LB2c in the annular spot shape S3 passes through the pinhole 117a. However, the second reflected beam LB2d in the annular spot shape S4 is blocked by the pinhole mask 117. It should be noted that the diameter of the pinhole 117a formed in the pinhole mask 117 is specified in consideration of the thickness of the workpiece W, the position of the condensing point Pb, and other factors so that the first reflected beam LB2c in the annular spot shape S3 passes through the pinhole 117a, but the second reflected beam LB2d in the annular spot shape S4 is blocked by the pinhole mask 117. As described above, the second reflected beam LB2d in the annular spot shape S4 reflected by the lower face of the workpiece W is blocked by the pinhole mask 117. Only the first reflected beam LB2c in the annular spot shape S3 reflected by the upper face of the workpiece W passes through the pinhole 117a of the pinhole mask 117.

The polarization plane of the first reflected beam LB2c in the annular spot shape S3 that was reflected by the upper face of the workpiece W and that passed through the pinhole 117a of the pinhole mask 117 as described above is adjusted by the half wavelength plate 118 so that the polarization plane is at 45 degrees to the second polarized beam splitter 119, after which the first reflected beam LB2c reaches the second polarized beam splitter 119. The first reflected beam LB2c that has reached the second polarized beam splitter 119 is divided by the same beam splitter 119 into the fourth and fifth optical paths 11d and 11e. All the first reflected beam LB2c in the annular spot shape S3 divided into the fourth optical path 11d is condensed by the condenser lens 120 and received by the first photoreception element 121. The first photoreception element 121 transmits, to the control means 80, a voltage signal whose level is proportional to the amount of light received. On the other hand, the first reflected beam LB2c in the annular spot shape S3 divided into the fifth optical path 11e is condensed one-dimensionally by the cylindrical lens 124 of the photoreception range restriction means 123, restricted to a given unit length by the one-dimensional mask 125, and received by the second photoreception element 122. Then, the second photoreception element 122 transmits, to the control means 80, a voltage signal whose level is proportional to the amount of light received.

A description will be given here of the amount of light of the first reflected beam LB2c in the annular spot shape S3 received by the first and second photoreception elements 121 and 122. The amount of light of the first reflected beam LB2c in the annular spot shape S3 received by the first photoreception element 121 is constant because all the first reflected beam LB2c is condensed by the condenser lens 120. Therefore, the voltage level (V1) output from the first photoreception element 121 is constant (e.g., 10 V). On the other hand, the amount of light of the first reflected beam LB2c in the annular spot shape S3 received by the second photoreception element 122 varies depending on the distance from the objective condenser lens 65 to the upper face of the workpiece W, i.e., the height position (thickness) of the workpiece W, during irradiation of the inspection laser beam LB1b onto the upper face of the workpiece W as illustrated in FIG. 4B. The reason for this is that the first reflected beam LB2c in the annular spot shape S3 received by the second photoreception element 122 is one-dimensionally condensed by the cylindrical lens 124 first and then restricted to a given unit length by the one-dimensional mask 125 before being received by the second photoreception element 122. Therefore, the voltage level (V2) output from the second photoreception element 122 varies depending on the height position of the upper face of the workpiece W irradiated with the inspection laser beam LB1b.

Figure 6A:
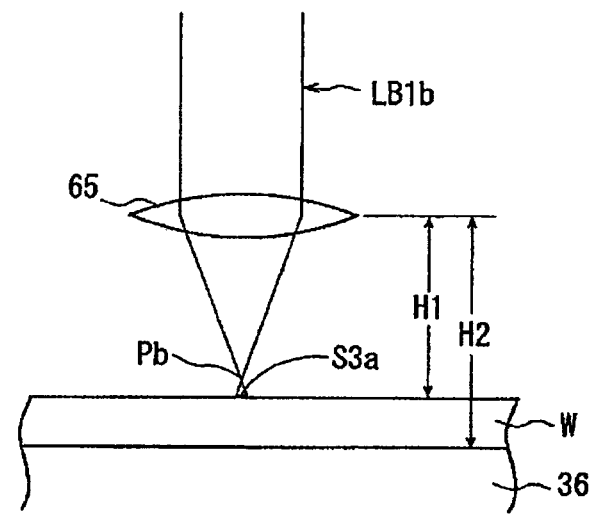
FIGS. 6A and 6B are explanatory diagrams illustrating the manner in which laser beams are irradiated by the confocal optical height position detection means illustrated in FIG. 3 onto workpieces, different in thickness, held by the chuck table.

For example, if the height position of the workpiece W is high (the workpiece W is thick) as illustrated in FIG. 6A, and therefore, a distance (H1) from the objective condenser lens 65 to the upper face of the workpiece W is small, the inspection laser beam LB1b is reflected in the shape of an annular spot S3a in which the same beam LB1b is irradiated onto the upper face of the workpiece W. This reflected beam is divided by the second polarized beam splitter 119 into the fourth and fifth optical paths 11d and 11e as described earlier. All the reflected beam in the shape of the annular spot S3a divided into the fourth optical path 11d is condensed by the condenser lens 120. Therefore, all the amount of light of the reflected beam is received by the first photoreception element 121. On the other hand, the reflected beam in the shape of the annular spot S3a divided by the second polarized beam splitter 119 into the fifth optical path 11e is condensed one-dimensionally by the cylindrical lens 124. As a result, the cross-section of the reflected beam is approximately rectangular. The reflected beam whose cross-section has been reduced to an approximately rectangular shape is restricted to a given unit length by the one-dimensional mask 125. As a result, part of the reflected beam divided into the fifth optical path 11e is received by the second photoreception element 122. Therefore, the amount of light of the reflected beam received by the second photoreception element 122 is smaller than that received by the first photoreception element 121.

Figure 6B:
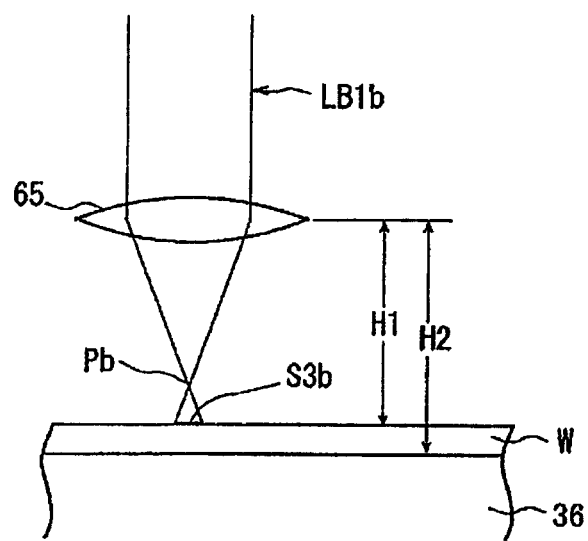

Next, if the height position of the workpiece W is low (the workpiece W is thin) as illustrated in FIG. 6B, and therefore, the distance (H1) from the objective condenser lens 65 to the upper face of the workpiece W is large, the inspection laser beam LB1b is reflected in the shape of an annular spot S3b in which the same beam LB1b is irradiated onto the upper face of the workpiece W. This annular spot S3b is larger than the annular spot S3a. The reflected beam in the shape of the annular spot S3b is divided by the second polarized beam splitter 119 into the fourth and fifth optical paths 11d and 11e as described earlier. All the reflected beam in the shape of the annular spot S3b divided into the fourth optical path 11d is condensed by the condenser lens 120. Therefore, all the amount of light of the reflected beam is received by the first photoreception element 121. On the other hand, the reflected beam in the shape of the annular spot S3b divided by the second polarized beam splitter 119 into the fifth optical path 11e is condensed one-dimensionally by the cylindrical lens 124. As a result, the cross-section of the reflected beam is approximately rectangular. Because the annular spot S3b of the reflected beam is larger than the annular spot S3a, each of the long sides of the approximate rectangle is longer than that of the annular spot S3a. The reflected beam whose cross-section has been condensed to an approximately rectangular shape is restricted to a given length by the one-dimensional mask 125, and part thereof is received by the second photoreception element 122. Therefore, the amount of light received by the second photoreception element 122 is smaller than in the case illustrated in FIG. 6A. As described above, the larger the distance (H1) from the objective condenser lens 65 to the upper face of the workpiece W, that is, the taller the workpiece W (the thicker the workpiece W), the more amount of light of the reflected beam is received by the second photoreception element 122. The smaller the distance (H1) from the objective condenser lens 65 to the upper face of the workpiece W, that is, the shorter the workpiece W (the thinner the workpiece W), the less amount of light of the reflected beam is received by the second photoreception element 122.

Figure 7:
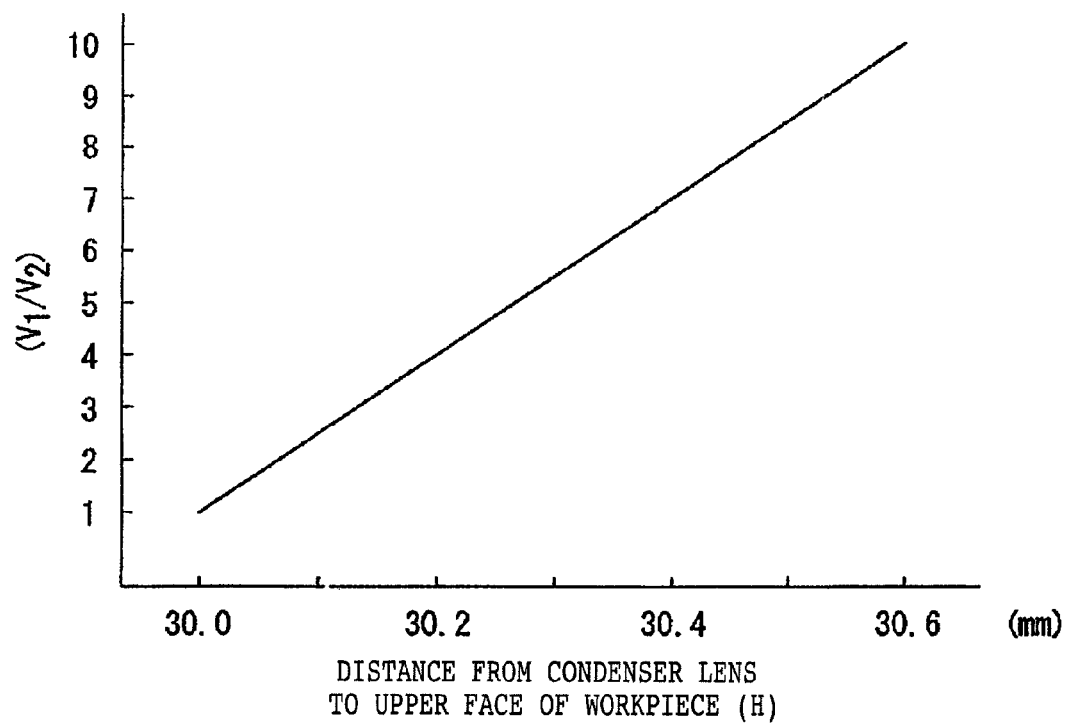
FIG. 7 is a control map illustrating the relationship between the ratio between two voltages, voltages (V1) and (V2) output respectively from first and second light-receiving elements making up the confocal optical height position detection means illustrated in FIG. 3, and the distance from a condenser to the upper face of the workpiece.

A description will be given here of the relationship between the ratio between the voltage level (V1) output from the first photoreception element 121 and the voltage level (V2) output from the second photoreception elements 122 and the distance (H1) from the objective condenser lens 65 to the upper face of the workpiece W, that is the height position of the workpiece W, with reference to the control map illustrated in FIG. 7. It should be noted that, in FIG. 7, the horizontal axis represents the distance (H1) from the objective condenser lens 65 to the upper face of the workpiece W, and the vertical axis represents the ratio (V1/V2) between the voltage level (V1) output from the first photoreception element 121 and the voltage level (V2) output from the second photoreception element 122. In the example illustrated in FIG. 7, when the distance (H1) from the objective condenser lens 65 to the upper face of the workpiece W is 30.0 mm, the ratio (V1/V2) between the two voltages is set to "1," and when the distance (H1) from the objective condenser lens 65 to the upper face of the workpiece W is 30.6 mm, the ratio (V1/V2) between the two voltages is set to "10." Therefore, it is possible to find the distance (H1) from the objective condenser lens 65 to the upper face of the workpiece W by finding the ratio (V1/V2) between the voltage level (V1) output from the first photoreception element 121 and the voltage level (V2) output from the second photoreception element 122 and comparing the ratio (V1/V2) between the two voltage levels against the control map illustrated in FIG. 7. It should be noted that the control map illustrated in FIG. 7 is stored in a memory of the control means 80. When the distance (H1) from the objective condenser lens 65 to the upper face of the workpiece W is found as described above, it is possible to find a distance (H) from the front face of the chuck table 36 to the upper face of the workpiece W held by the chuck table 36, that is, the height position of the upper face of the workpiece W, by subtracting the distance (H1) from the objective condenser lens 65 to the upper face of the workpiece W from a distance (H2) from the objective condenser lens 65 to the front face of the chuck table 36. It should be noted that the distance (H2) from the objective condenser lens 65 to the front face of the chuck table 36 can be found by a detection signal from the Z-axis direction position detection means 54.

The confocal optical height position detection means 11 is configured as described above. The same means 11 shapes the inspection laser beam LB1a having the circular spot shape S1 oscillated by the inspection laser beam oscillation means 111 into the inspection laser beam LB1b having the annular spot shape S2 using the annular spot formation means 112 and irradiates this inspection laser beam LB1b having the annular spot shape S2 onto the workpiece W. Therefore, the inspection laser beam LB1b having the annular spot shape S2 irradiated onto the workpiece W as illustrated in FIG. 4B is reflected by the upper face in the annular spot shape S3. If the workpiece W is transparent, the inspection laser beam LB1b is reflected by the lower face in the annular spot shape S4. Then, the second reflected beam LB2d in the annular spot shape S4 reflected by the lower face of the workpiece W is blocked by the pinhole mask 117. The amount of received light is detected based on the first reflected beam LB2c in the annular spot shape S3 reflected by the upper face of the workpiece W that has passed through the pinhole 117a of the pinhole mask 117. This makes it possible to accurately detect the position of the upper face of the workpiece W even if the workpiece W is transparent.

An example of the confocal optical height position detection means has been described above. However, the confocal optical height position detection means is not limited to the embodiment illustrated in FIGS. 3 to 7. As the confocal optical height position detection means, not only that using the optics disclosed in Japanese Patent Laid-open No. 2008-170366 but also that using the optics disclosed in Japanese Patent Laid-open Nos. 2007-331049, 2006-324397 and 1986-198204 can be used. The optics disclosed in Japanese Patent Laid-open No. 2008-170366 splits white light into various wavelengths, arranges a plurality of condensing points, different for each wavelength, along the optical axis, and detects the position of the upper face of a workpiece using the wavelength of light reflected by the front face of the workpiece. The optics disclosed in Japanese Patent Laid-open Nos. 2007-331049, 2006-324397 and 1986-198204 images the upper face of a workpiece and detects the position of the upper face of the workpiece by image processing.

Figure 8A:
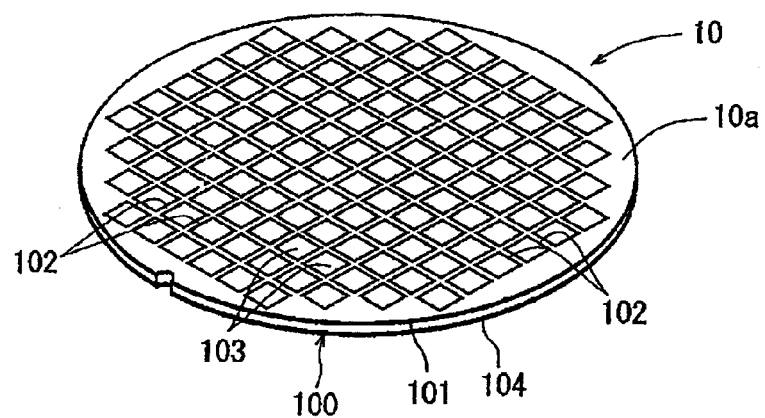
FIG. 8A is a perspective view of an optical device wafer as a workpiece.
Figure 8B:
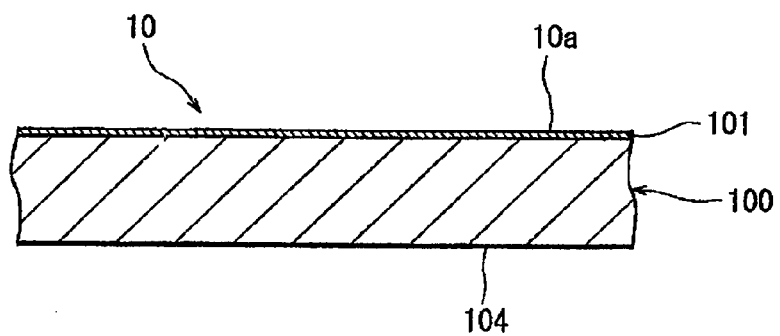
FIG. 8B is an enlarged cross-sectional view of a main part of the optical device wafer.

The confocal optical height position detection means 11 in the present embodiment is configured as described above. A description will be given below of the workings of the same means 11. FIG. 8A is a perspective view of an optical device wafer as a workpiece to be laser-machined. FIG. 8B is an enlarged cross-sectional view of a main part of the optical device wafer. An optical device wafer 10 illustrated in FIG. 8A is formed, for example, by stacking a light-emitting layer (epitaxial layer) 101 of 5 μm in thickness on a sapphire substrate 100 that is 50 mm in diameter and 200 μm in thickness. The light-emitting layer 101 is made of a nitride semiconductor. Then, optical devices 103 such as light-emitting diodes or laser diodes are formed in a plurality of areas of the light-emitting layer 101 partitioned by a plurality of scheduled division lines 102 that are formed in a grid pattern. A transparent reflecting film 104 called DBR film is formed on the back face of the sapphire substrate 100 making up the optical device wafer 10. The reflecting film 104 is made, for example, of silicon oxide to provide improved brightness.

A description will be given below of how a modified layer is formed along the scheduled division lines 102 inside the optical device wafer 10 using the laser machining apparatus 1 described above. It should be noted that variations in thickness of the optical device wafer 10 during formation of a modified layer inside the same wafer 10 make it impossible to evenly form the modified layer to a given depth due to the relationship with the refractive index as described earlier. For this reason, the position of the upper face of the optical device wafer 10 held by the chuck table 36 is measured using the interferometric height position detection means 6 and the confocal optical height position detection means 11 prior to laser machining. That is, the optical device wafer 10 is placed first on the chuck table 36 of the laser machining apparatus 1 illustrated in FIG. 1 with a back face 10b (side on which the reflecting film 104 is formed) of the optical device wafer 10 facing up. Then, the optical device wafer 10 is sucked and held on the chuck table 36. The chuck table 36 that has sucked and held the optical device wafer 10 is positioned immediately under the imaging means 95 by the machining feed means 37.

When the chuck table 36 is positioned immediately under the imaging means 95, an alignment process is performed by the imaging means 95 and the control means 80 to detect the target area of the optical device wafer 10 to be laser-machined. That is, the imaging means 95 and the control means 80 perform image processing such as pattern matching and proceed with alignment of the detection position. Image processing is designed to achieve registration between the scheduled division lines 102 formed in a first direction of the optical device wafer 10 and the objective condenser lens 65 of the interferometric height position detection means 6 making up the position detection/laser irradiation unit 5. Further, alignment of the detection position is also performed for the scheduled division lines 102 formed on the optical device wafer 10 in a direction orthogonal to the first direction. At this time, a front face 10a of the optical device wafer 10 on which the scheduled division lines 102 are formed is on the lower side. However, the imaging means 95 includes, as described above, infrared lighting means, optics, and an imaging element (infrared CCD), and so on. The optics captures infrared radiation. The imaging element (infrared CCD) outputs an electric signal whose level is proportional to the infrared radiation. Therefore, the scheduled division lines 102 can be captured through the optical device wafer 10 from the back face 10b.

Figure 9A:
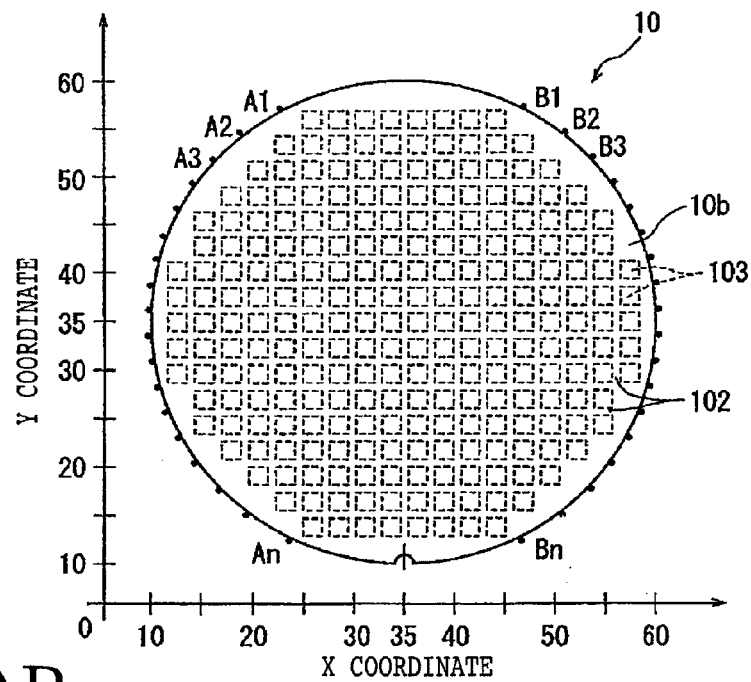
FIGS. 9A and 9B are explanatory diagrams illustrating the relationship between the orientation of the optical device wafer illustrated in FIGS. 8A and 8B and coordinate positions when the wafer is held at a given position of the chuck table of the laser machining apparatus illustrated in FIG. 1.
Figure 9B:
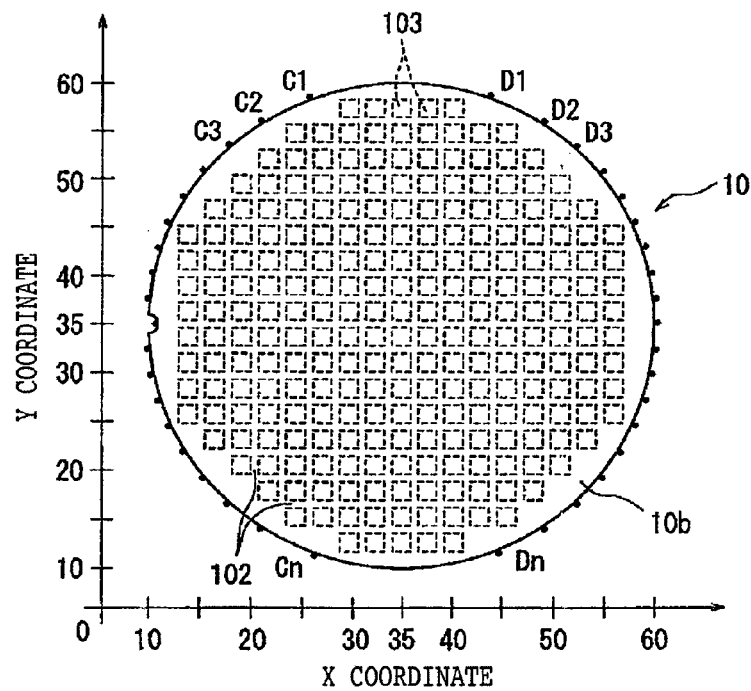

When alignment is performed as described above, the optical device wafer 10 on the chuck table 36 is located at the coordinate position illustrated in FIG. 9A. It should be noted that FIG. 9B illustrates that the chuck table 36, i.e., the optical device wafer 10, is rotated 90 degrees from the orientation illustrated in FIG. 9A. It should be noted that design value data of the coordinate values of the feed start positions (A1, A2, A3, . . . An), the coordinate values of the feed end positions (B1, B2, B3, . . . Bn), the coordinate values of the feed start positions (C1, C2, C3, . . . Cn), and the coordinate values of the feed end positions (D1, D2, D3, . . . Dn) of the scheduled division lines 102 formed on the optical device wafer 10 as located at the coordinate values illustrated in FIGS. 9A and 9B is stored in the memory of the control means 80.

Figure 10:
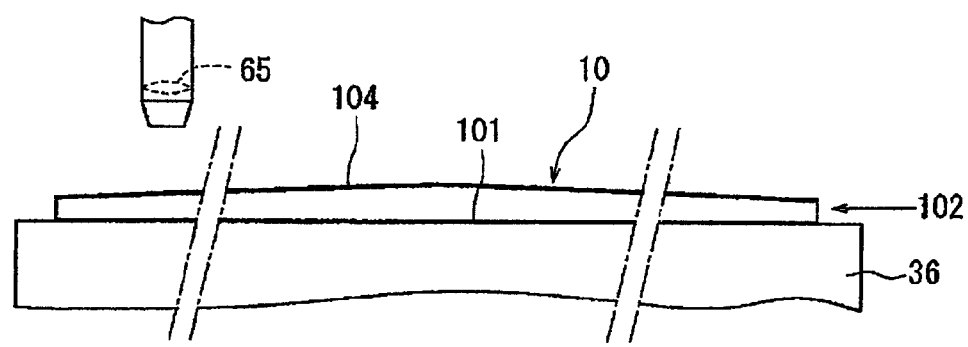
FIG. 10 is an explanatory diagram of height position detection performed by an interferometric height position detection means and the confocal optical height position detection means incorporated in the laser machining apparatus illustrated in FIG. 1.

Next, the height position of the optical device wafer 10 is detected by each of the interferometric height position detection means 6 and the confocal optical height position detection means 11. In order to detect the height position of the optical device wafer 10 by the interferometric height position detection means 6 and the confocal optical height position detection means 11, an arbitrary scheduled division line 102 is positioned immediately under the objective condenser lens 65 as illustrated in FIG. 10. Then, the interferometric height position detection means 6 is activated first to detect a height position (Ha) of the optical device wafer 10 as described above. Next, the confocal optical height position detection means 11 is activated to detect a height position (Hb) of the optical device wafer 10 as described above. When the height positions (Ha) and (Hb) of the optical device wafer 10 are detected, respectively, by using the interferometric height position detection means 6 and the confocal optical height position detection means 11, the control means 80 finds a difference (Hx) between the height positions (Ha) and (Hb), storing the difference as a correction value (Hx)=(Ha)-(Hb) in the memory.

Figure 11:
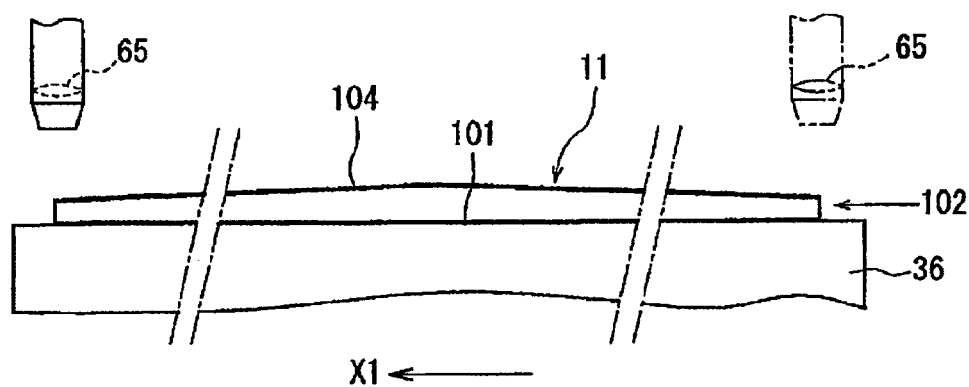
FIG. 11 is an explanatory diagram of a height position detection process performed by the interferometric height position detection means incorporated in the laser machining apparatus illustrated in FIG. 1.

When the correction value (Hx)=(Ha)-(Hb) is found as described above, the chuck table 36 is moved so that the uppermost scheduled division line 102 in FIG. 9A is positioned immediately under the objective condenser lens 65. Then, the feed start position coordinate value (A1) (refer to FIG. 9A), one end (left end in FIG. 11) of the scheduled division line 102, is positioned immediately under the objective condenser lens 65 as illustrated in FIG. 11. The interferometric height position detection means 6 is then activated. At the same time, the chuck table 36 is moved in a direction shown by an arrow X1 in FIG. 11 to the feed end position coordinate value (B1) (height position detection process). As a result, the height position of the upper face is measured along the uppermost scheduled division line 102 in FIG. 9A by the interferometric height position detection means 6. This measured height position is stored in the memory of the control means 80. As described above, the height position detection process is performed along all the scheduled division lines 102 formed on the optical device wafer 10. The height position of the upper face at each of the scheduled division lines 102 is stored in the memory of the control means 80. Then, the control means 80 stores, in the memory, a value obtained by correcting the height position of the upper face at each of the scheduled division lines 102 detected by the height position detection process with the correction value (Hx) as a corrected height position. As a result, the height position of the upper face at each of the scheduled division lines 102 measured by the interferometric height position detection means 6 is corrected by the measured value of the confocal optical height position detection means 11 that offers accuracy in height position measurement even in the event of disturbance in the interference between the beam reflected by the upper face of the optical device wafer 10 and the reference beam.

When the height position detection process is performed along all the scheduled division lines 102 formed on the optical device wafer 10, a modified layer formation process is performed to form a modified layer inside the optical device wafer 10 along the scheduled division lines 102.

Figure 12A:
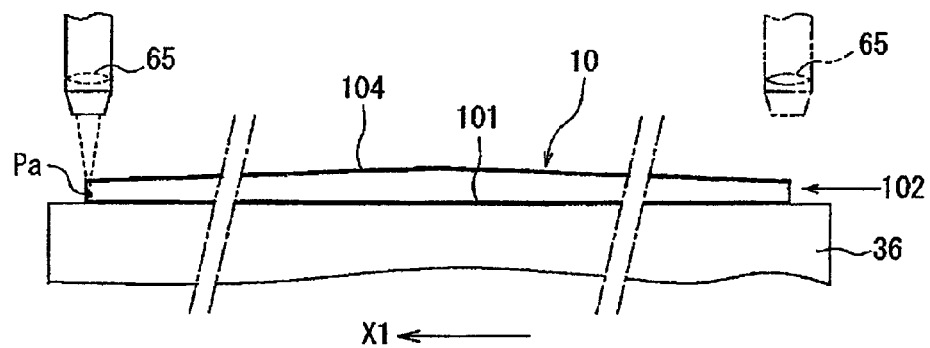
FIGS. 12A and 12B are explanatory diagrams of a modified layer formation process performed by the laser machining apparatus illustrated in FIG. 1.

In order to perform the modified layer formation process, the chuck table 36 is moved first so that the uppermost scheduled division line 102 in FIG. 9A is positioned immediately under the objective condenser lens 65. The feed start position coordinate value (A1) (refer to FIG. 9A), one end (left end in FIG. 12A) of the scheduled division line 102, is further positioned immediately under the objective condenser lens 65 as illustrated in FIG. 12A. Then, a condensing point Pa of the pulsed laser beam irradiated from the objective condenser lens 65 making up the laser beam irradiation means 9 is set to a given depth position from the back face 10b (upper face) of the scheduled division line 102. Next, the laser beam irradiation means 9 is activated, and then the chuck table 36 is moved at a given machining feed rate in the direction shown by the arrow X1 while at the same time irradiating, from the objective condenser lens 65, a pulsed laser beam at a wavelength that penetrates the sapphire substrate (laser machining process). Then, when the irradiation position of the objective condenser lens 65 reaches the other end (right end in FIG. 12B) of the scheduled division line 102 as illustrated in FIG. 12B, the irradiation of the pulsed laser beam is stopped, and the movement of the chuck table 36 is also stopped.

Figure 12B:
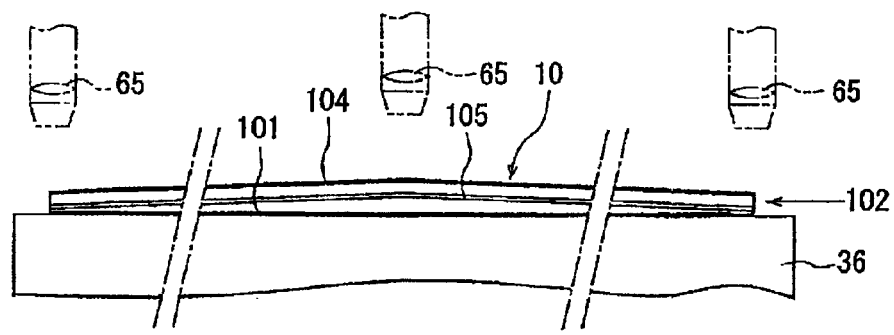

In the modified layer formation process, the control means 80 controls the first condensing point position adjustment means 650 based on the height position of the back face 10b (upper face) at the scheduled division line 102 of the optical device wafer 10 stored in the memory, moves the position detection/laser irradiation unit 5 in the Z-axis direction (condensing point position adjustment direction), and moves the objective condenser lens 65 making up the laser beam irradiation means 9 vertically in accordance with the height position of the back face 10b (upper face) at the scheduled division line 102 of the optical device wafer 10 as illustrated in FIG. 12B. As a result, a modified layer 105 is formed inside the optical device wafer 10 at a given depth position from and parallel to the back face 10b (upper face) as illustrated in FIG. 12B.

The machining conditions in the above modified layer formation process are, for example, as follows:
Light source: LD-excited Q switch Nd:YVO4 pulsed laser
Wavelength: 1064 nm
Repetition frequency: 100 kHz
Mean output: 0.3 W
Condensing spot diameter: 1 μm
Machining feed rate: 400 mm/sec When the modified layer formation process is performed along all the scheduled division lines 102 extending in the first direction of the optical device wafer 10 as described above, the chuck table 36 is rotated 90 degrees to perform the modified layer formation process along the scheduled division lines 102 extending in the direction orthogonal to the first direction. When the modified layer formation process is performed along all the scheduled division lines 102 formed on the optical device wafer 10 as described above, the chuck table 36 holding the optical device wafer 10 is returned to the position where it sucked and held the same wafer 10 first. Here, the chuck table 36 stops sucking and holding the optical device wafer 10. The same wafer 10 is then transferred to a division process by unshown transfer means.

The present invention has been described above with reference to the illustrated embodiment. However, the present invention is not limited to the embodiment but may be modified in various ways without departing from the scope of the invention. For example, the present invention is applicable to the laser machining apparatus described in Japanese Patent Laid-open No. 2012-2604. This laser machining apparatus has two interferometric height position detection means, one on each side of the objective condenser lens 65 in the machining feed direction, so as to perform laser machining while at the same time detecting the height position of the upper face of the workpiece in response to forward and return trips of the chuck table.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A laser machining apparatus comprising:

a chuck table having a holding face adapted to hold a workpiece;

laser beam irradiation means having an objective condenser lens adapted to condense and irradiate a laser beam onto the workpiece held by the chuck table;

interferometric height position detection means adapted to detect a height position of an upper face of the workpiece held by the chuck table based on the interference between light reflected from the upper face of the workpiece and reference light;

condensing point position adjustment means adapted to move the objective condenser lens vertically relative to the holding face of the chuck table;

control means adapted to control the condensing point position adjustment means based on the height position of the upper face of the workpiece detected by the interferometric height position detection means; and confocal optical height position detection means adapted to detect the height position of the upper face of the workpiece held by the chuck table, wherein the control means specifies, as a correction value, the difference between the two height positions of the upper face of the workpiece held by the chuck table, one detected by the confocal optical height position detection means and another detected by the interferometric height position detection means, and the control means controls the condensing point position adjustment means based on the height position obtained by correcting the height position of the upper face of the workpiece detected by the interferometric height position detection means using the correction value.

* * * * *